United States Patent
Chien et al.

(10) Patent No.: US 8,871,639 B2
(45) Date of Patent: Oct. 28, 2014

(54) SEMICONDUCTOR DEVICES AND METHODS OF MANUFACTURE THEREOF

(71) Applicant: Taiwan Semiconductor Manufacturing Company, Ltd., Hsin-Chu (TW)

(72) Inventors: Ying-Hsueh Chang Chien, Hsin-Chu (TW); Yu-Ming Lee, New Taipei (TW); Man-Kit Leung, Taipei (TW); Chi-Ming Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 9 days.

(21) Appl. No.: 13/734,892

(22) Filed: Jan. 4, 2013

(65) Prior Publication Data
US 2014/0191400 A1      Jul. 10, 2014

(51) Int. Cl.
*H01L 21/4763* (2006.01)
*H01L 23/522* (2006.01)
*H01L 21/768* (2006.01)

(52) U.S. Cl.
CPC ...... *H01L 21/76841* (2013.01); *H01L 23/5226* (2013.01)
USPC ........... 438/639; 438/627; 438/672; 438/675; 257/E23.145; 257/751; 257/774

(58) Field of Classification Search
CPC ................... H01L 21/76831; H01L 21/76897; H01L 21/76802
USPC ........... 257/E23.145, E21.577, E21.585, 751, 257/758, 774, 775; 438/627, 629, 637, 639, 438/640, 643, 653, 667, 668, 672, 675, 700, 438/701, 713, 927, 978
See application file for complete search history.

(56) References Cited

U.S. PATENT DOCUMENTS

| | | | |
|---|---|---|---|
| 7,259,091 B2 * | 8/2007 | Schuehrer et al. | 438/627 |
| 7,396,759 B1 * | 7/2008 | van Schravendijk et al. | 438/625 |
| 7,928,004 B2 * | 4/2011 | Seidel et al. | 438/637 |
| 8,193,086 B2 * | 6/2012 | Letz et al. | 438/630 |
| 2005/0170269 A1 * | 8/2005 | Nakagawa et al. | 430/30 |
| 2007/0082488 A1 * | 4/2007 | Katou | 438/687 |
| 2009/0134521 A1 * | 5/2009 | Liu et al. | 257/762 |
| 2009/0283910 A1 * | 11/2009 | Hinomura | 257/751 |

OTHER PUBLICATIONS

Lu, X., et al., "Low-temperature rapid synthesis of high-quality pristine or boron-doped graphene via Wurtz-type reductive coupling reaction," Journal of Materials Chemistry, 2011, DOI: 10.1039/c1jm11184a; www.rsc.org/materials, 5 pages.

* cited by examiner

*Primary Examiner* — Chris Chu
(74) *Attorney, Agent, or Firm* — Slater & Matsil, L.L.P.

(57) ABSTRACT

Semiconductor devices and methods of manufacture thereof are disclosed. In one embodiment, a method of manufacturing a semiconductor device includes providing a workpiece including an insulating material layer disposed thereon. The insulating material layer includes a trench formed therein. The method includes forming a barrier layer on the sidewalls of the trench using a surface modification process and a surface treatment process.

20 Claims, 4 Drawing Sheets

SEMICONDUCTOR DEVICES AND METHODS OF MANUFACTURE THEREOF

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line.

The semiconductor industry continues to improve the integration density of various electronic components, e.g., transistors, diodes, resistors, capacitors, conductive lines, vias, etc. of integrated circuits by continual reductions in minimum feature size, which allow more components to be integrated into a given area. Some recent reduced feature size conductive line and via designs utilize low dielectric constant (k) insulating materials having a dielectric constant less than a dielectric constant of silicon dioxide for insulating materials, and copper or copper alloys for conductive material. These material systems can present manufacturing challenges in some applications. As an example, copper tends to diffuse into some low k insulating materials, so that the use of barrier layers in the conductive line and via structures is required.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Figure 1:
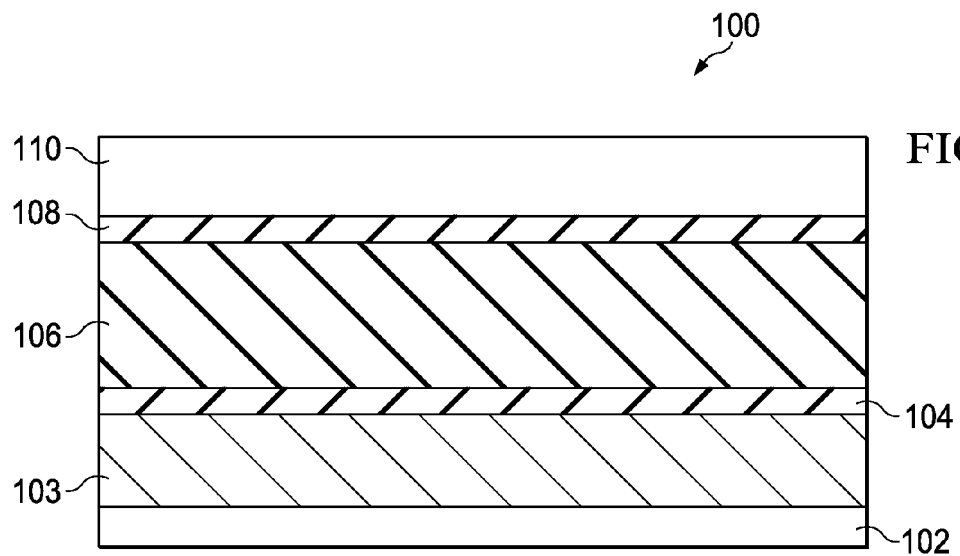
FIGS. 1 through 8 are cross-sectional views of a semiconductor device at various stages of manufacturing in accordance with some embodiments of the present disclosure.

FIGS. 1 through 8 are cross-sectional views illustrating a semiconductor device at various stages of manufacturing in accordance with some embodiments of the present disclosure. Referring first to FIG. 1, there is shown a semiconductor device 100 that includes a workpiece 102. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

A conductive material 103 is formed over the workpiece 102. The conductive material 103 comprises Cu, a Cu alloy, other metals, or combinations thereof. Alternatively, the conductive material 103 may comprise other materials. The conductive material 103 is patterned into desired conductive features (not shown), such as conductive lines or traces, resistors, capacitor plates, or inductors, as examples. Alternatively, the conductive material 103 may be patterned with other features. The conductive material 103 may be formed using subtractive techniques, by depositing the conductive material 103 over the workpiece 102 and patterning the conductive material 103 using lithography. An insulating material (not shown) is then formed between the conductive features of the conductive material 103. Alternatively, the conductive material 103 may be formed using a damascene technique, by forming an insulating material over the workpiece 102, patterning the insulating material, and filling the patterned insulating material with the conductive material 103. Alternatively, the conductive material 103 may be formed using other methods. The conductive material 103 comprises a thickness of about 10 to 10,000 nm in some embodiments. Alternatively, the conductive material 103 may comprise other dimensions.

An etch stop layer (ESL) 104 is formed over the conductive material 103 in some embodiments. The ESL 104 comprises SiN, SiC, tetraethyl orthosilicate (TEOS), other insulating materials, or combinations thereof. Alternatively, the ESL 104 may comprise other materials. The ESL 104 comprises a thickness of about 1 nm to 1,000 nm in some embodiments. Alternatively, the ESL 104 may comprise other dimensions. The ESL 104 is not included in some embodiments. The ESL 104 may alternatively or may also comprise an adhesion layer, for example.

An insulating material layer 106 is formed over the ESL 104, or over the conductive material 103 if the ESL 104 is not included. The insulating material layer 106 comprises a low dielectric constant (k) insulating material in some embodiments having a dielectric constant or k value lower than the k value of silicon dioxide, which is about 3.9. In some embodiments, the insulating material layer 106 comprises an extra-low dielectric constant (ELK) material having a dielectric constant of less than about 2.5, as another example. The insulating material layer 106 comprises a material such as boron-doped silicon glass (BSG), phosphosilicate glass (PSG), fluorinated silicate glass (FSG), black Diamond™ available from Applied Materials, or other materials having a dielectric constant that is lower than a dielectric constant of $SiO_2$, as examples, although alternatively, the insulating material layer 106 may comprise other materials. The insulating material layer 106 comprises a thickness of about 10 nm to 1,000,000 nm in some embodiments. Alternatively, the insulating material layer 106 may comprise other dimensions.

An ESL and/or hard mask 108 is formed over the insulating material layer 106 in some embodiments. The ESL and/or hard mask 108 comprises similar materials and dimensions as described for ESL 104, for example. The ESL and/or hard mask 108 is not included in some embodiments. The ESL and/or hard mask 108 may alternatively or may also comprise an adhesion layer, for example.

A photosensitive material 110 is formed over the ESL and/or hard mask 108, or over the insulating material layer 106 if the ESL and/or hard mask 108 is not included. The photosensitive material 110 comprises a photoresist or other photosensitive material. The photosensitive material 110 comprises a thickness of about 10 nm to 1,000,000 nm in some embodiments. Alternatively, the photosensitive material 110 may comprise other dimensions.

Figure 2:
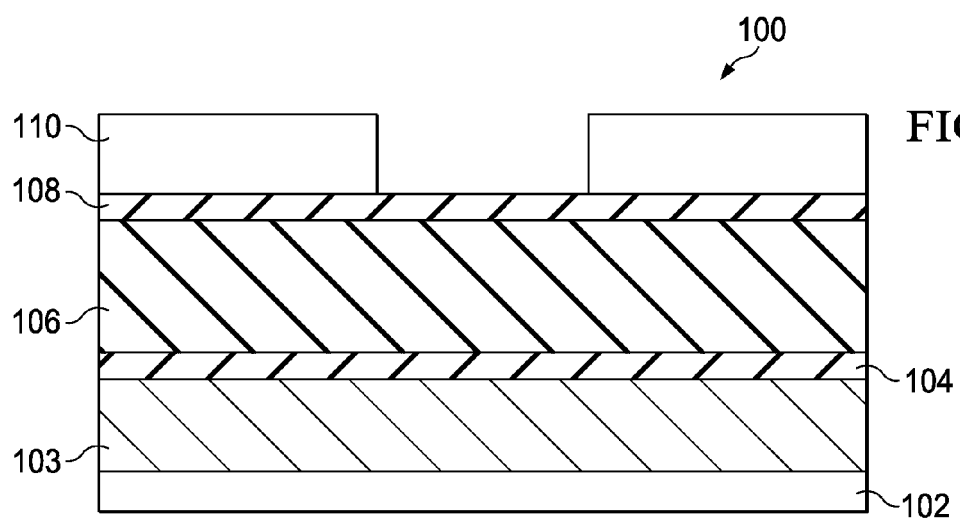

The photosensitive material 110 is patterned, as shown in FIG. 2. The photosensitive material 110 may be patterned using lithography, by exposing the photosensitive material 110 to light or energy reflected from or transmitted through a lithography mask having the desired pattern formed thereon. The photosensitive material 110 is developed, and exposed or unexposed portions (depending on whether the photosensitive material 110 comprises a positive or negative photoresist, for example) are ashed or etched away, forming the patterns in the photosensitive material 110 shown in FIG. 2. Alternatively, the photosensitive material 110 may be patterned using a direct patterning method, for example. The patterns in the photosensitive material 110 comprise a desired width for vias (not shown in FIG. 2; see via 140 in FIG. 8) that will be formed in the insulating material layer 106 in some embodiments.

Figure 3:
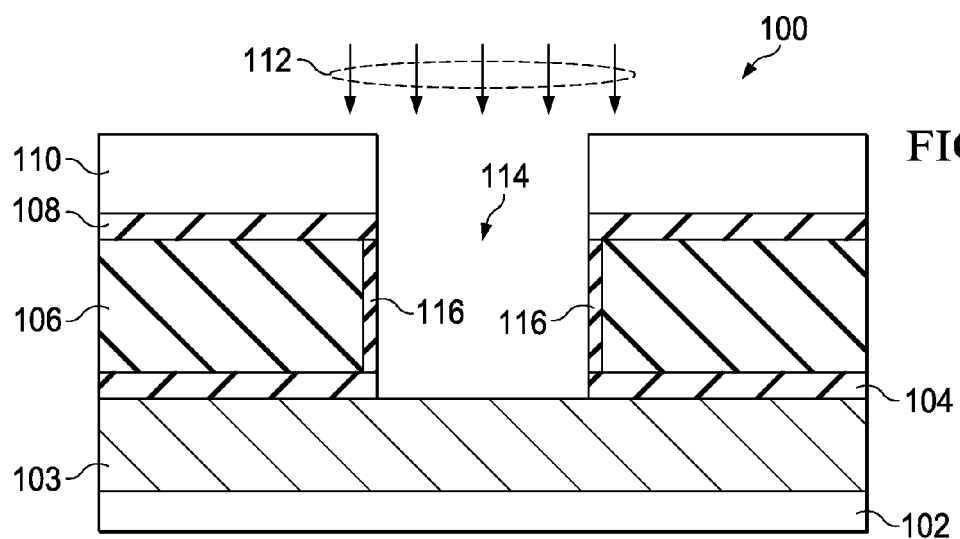

An etch process 112 is used to transfer the pattern of the photosensitive material 110 to the underlying insulating material layer 106 and the ESLs 104 and ESL and/or hard mask 108, if included in the structure, forming a trench 114, as shown in FIG. 3. The photosensitive material 110 is used as an etch mask during the etch process 112 for at least the insulating material layer 106, for example. A portion of the top surface of the conductive material 103 is exposed at the bottom of the trench 114. Only one trench 114 is shown in the drawings; however, a plurality of trenches 114 may be formed across the surface of the workpiece 102, depending on the design of the semiconductor device 100.

The etch process 112 comprises a dry etch process in some embodiments. Alternatively, the etch process 112 may comprise other types of etch processes. The etch process 112 forms damaged regions 116 on sidewalls of the trench 114 in some embodiments. In other embodiments, the damaged regions 116 are not formed by the etch process 112, but rather, by the removal later of the photosensitive material 110. In yet other embodiments, the damaged regions 116 are formed by both the etch process 112 of the insulating material layer 106 and also the removal of the photosensitive material 110.

Figure 4:
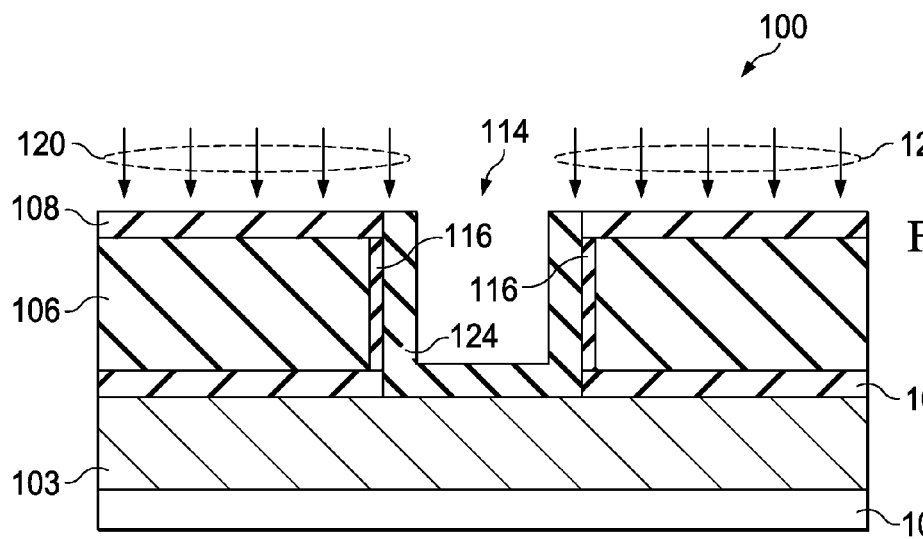

Next, in FIG. 4, the photosensitive material 110 is removed, leaving behind a residue 124 that lines the sidewalls and the bottom surface of the trench 114. The residue 124 comprises a polymer and/or other debris or materials, as examples. The photosensitive material 110 may be removed using an etch process and/or an ash process, as examples. The sidewalls of the trench 114 may be damaged during the removal of the photosensitive material 110, forming the damaged regions 116. Additional damage may be caused to the damaged regions 116 during the removal of the photosensitive material 110, if the damaged regions 116 were formed when the trenches 114 were formed, as another example.

The damaged regions 116 comprise a hydrophilic material in some embodiments. The damaged regions 116 comprise a low k (LK) material such as BSG, PSG, FSG, black Diamond™, and other materials having a dielectric constant lower than a dielectric constant of $SiO_2$, as examples, although alternatively, the damaged region 116 may comprise other materials.

Next, a post etch residue removal (PERR) process 120 and a surface modification process 122 are performed on the semiconductor device 100, as shown in FIG. 4. The surface modification process 122 comprises introducing a surface modification compound comprising a hydrocarbon in some embodiments, for example. In some embodiments, the surface modification process 122 is performed in-situ, e.g., simultaneously, with the PERR process 120. A chemical such as a hydrocarbon can be added to the PERR process 120 to achieve the surface modification process 122, for example. In other embodiments, the surface modification process 122 is performed in a separate step, after the PERR process 120. In yet other embodiments, the surface modification process 122 is performed in a separate step, before the PERR process 120. The surface modification process 122 comprises introducing a surface modification compound that is adapted to modify the hydrophilic damaged regions 116 shown in FIG. 4 to form hydrophobic damaged regions 126 shown in FIG. 5, and to subsequently form a barrier layer 130 on the sidewalls of the trench 114 after a surface treatment process 128, as shown in FIG. 6.

Figure 5:
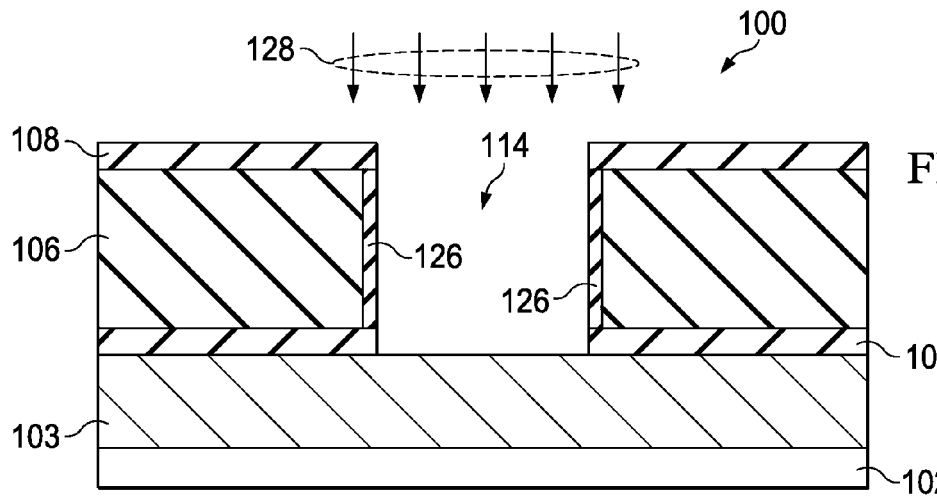
Figure 6:
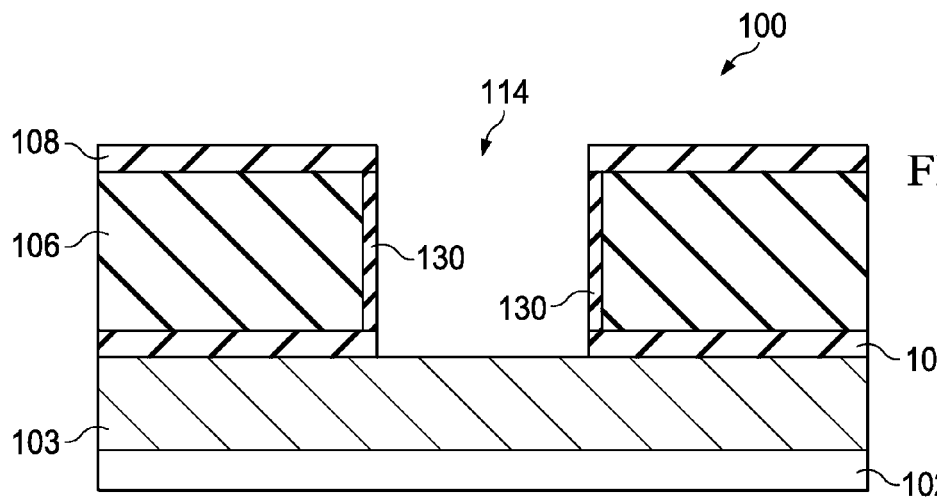

The PERR process 120 removes the residue 124 from over the top surface of the conductive material 103 and the damaged regions 116, as shown in FIG. 5. The surface modification process 122 converts the damaged regions 116 comprising a hydrophilic material shown in FIG. 4 to the damaged regions 126 comprising a hydrophobic material shown in FIG. 5.

A surface treatment process 128 is then performed on the semiconductor device 100, also shown in FIG. 5. The surface treatment process 128 comprises introducing a surface treatment compound comprising a hydrocarbon, a halocarbon, sulfured carbon, and/or silicon carbon, in some embodiments. In some embodiments, the surface treatment compound comprises an organic compound or an inorganic compound, as other examples. The surface treatment process comprises 128 heating, catalyzation, electrolization, photoirradiation, a method of forming composite materials, and/or combinations thereof in other embodiments, as examples. After surface treatment process 128, the surface formed on the trench sidewalls (e.g., the barrier layer 130) comprises a surface treatment product comprising hydrocarbon, halocarbon, sulfured carbon, silicon carbon, graphite, graphene, amorphous carbon, fullerene, and/or combinations thereof in other embodiments, as examples. The surface treatment process 128 comprises a graphization process, a carbonization process, a graphenization process, and/or combinations thereof, in other embodiments. Alternatively, the surface modification compound of the surface treatment process 122 and the surface treatment product of the surface treatment process 128 comprising the barrier layer 130 may comprise other chemicals or materials.

The barrier layer 130 includes the material used in the surface treatment process 128 and the damaged region 126 material. Advantageously, the barrier layer 130 is selectively formed on the sidewalls of the insulating material layer 106. For example, the barrier layer 130 is not formed on the top surface of the conductive material 103 at the bottom of the trench 113, as shown in FIG. 6. The barrier layer 130 is advantageously formed by altering the damaged regions 116/126 on the sidewalls of the trench 114. The barrier layer 130 comprises cobalt, ruthenium, tantalum, tantalum nitride, indium oxide, tungsten nitride, titanium nitride, and/or combinations thereof, as examples, although alternatively, the barrier layer 130 may comprise other materials.

Figure 7:
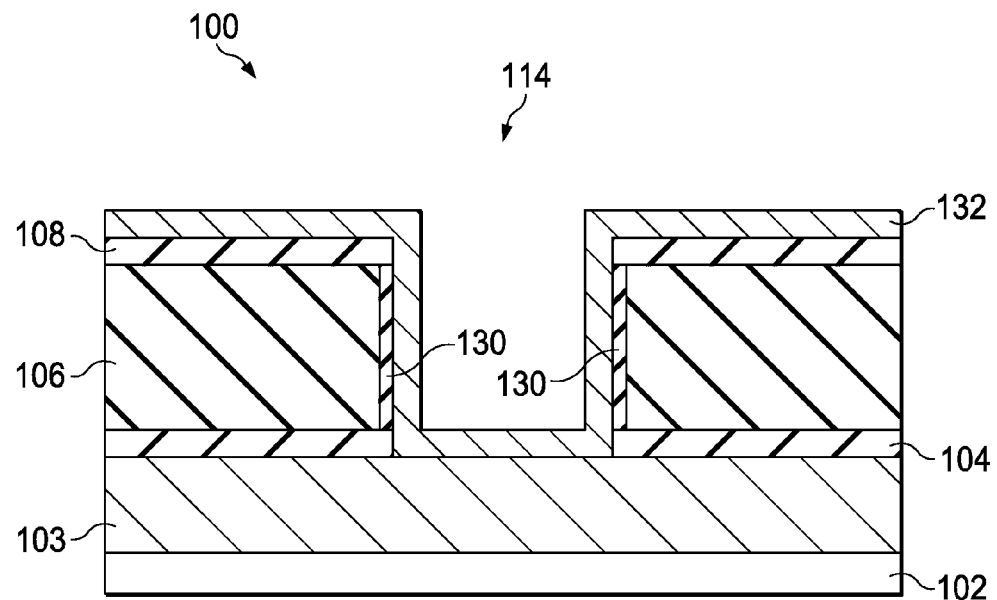
Figure 8:
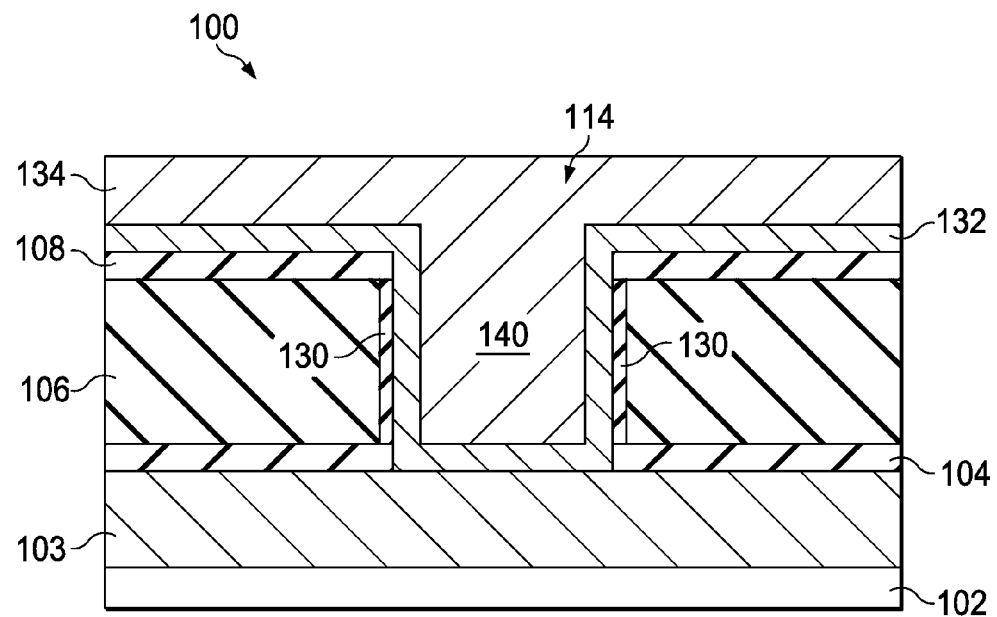

The manufacturing process for the semiconductor device 100 is then continued to form a via 140 in the trench 140, as shown in FIGS. 7 and 8. A seed layer 132 is formed over the insulating material layer 106 (e.g., over the ESL and/or hard mask 108 over the insulating material layer 106), over the barrier layer 130, and over the top surface of the conductive material 103 at the bottom of the trench 114, as shown in FIG. 7. The seed layer 132 comprises a conductive material such as Cu, a Cu alloy, or other conductive materials, as examples. A conductive material 134 is formed over the seed layer 132, filling the trench 114, as shown in FIG. 8. The conductive material 134 comprises Cu, a Cu alloy, or other conductive materials, as examples. The conductive material 134 is plated on using an electrochemical plating (ECP) process in some embodiments, as an example. The conductive material 134 may alternatively be formed using other methods. Conductive material 103 is also referred to herein as a first conductive material, and conductive material 134 is also referred to herein as a second conductive material, e.g., in some of the claims.

The seed layer 132 and conductive material 134 disposed within the trench 114 form a via 140. The via 140 comprises a conductive plug of material that is disposed between and electrically connects conductive material 103 to conductive material 134. The via 140 comprises a round, oval, square, rectangular, or other shapes in a top view of the workpiece 102, as examples.

Conductive material 134 may be patterned in some embodiments to form conductive lines or traces, resistors, capacitor plates, or inductors, as examples. The conductive material 134 may alternatively be patterned into other shapes. Conductive material 134 may later be patterned using a subtractive etch. Alternatively, conductive material 134 may be formed using a damascene process, as described for conductive material 103. Conductive material 134 may also be formed using a dual damascene process, wherein the vias 140 and conductive lines in the conductive material 134 disposed over the top surface of the insulating material layer 106 are simultaneously formed, as another example.

Figure 9:
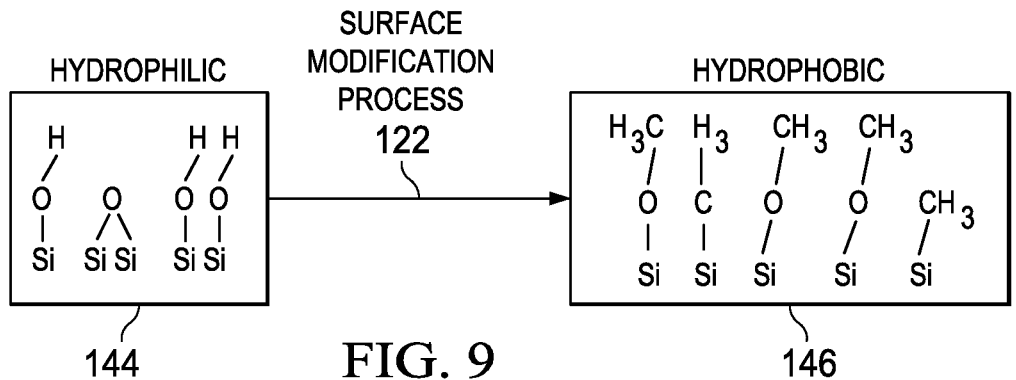
FIG. 9 is a diagram showing a chemical change of a damaged region of sidewalls of a trench in an insulating material layer after a surface modification process in accordance with an embodiment.

FIG. 9 is a diagram showing a chemical reaction (e.g., alkylation) of a damaged region 116 of a trench 114 sidewall of an insulating material layer 106 after a surface modification process 122 in accordance with an embodiment. By changing the functional group of the molecules, expected suitable materials can be synthesized in accordance with embodiments. The molecular structure of a hydrophilic damaged region 116 (see FIG. 4) comprising a LK material, such as BSG, PSG, FSG, black Diamond™, an ELK material, and other materials having a dielectric constant that is lower than a dielectric constant of $SiO_2$, is shown at 144. The molecular structure of a hydrophobic damaged region 126 (see FIG. 5) after the surface modification process 122 is shown at 146. Water molecules absorb less strongly on the non-polar —CH groups of the hydrophobic damaged region 126 material than on the polar —OH groups of the hydrophilic damaged region 116. The impact of the surface modification process 122 on the molecular structure of the damaged regions 116 to form damaged regions 126 advantageously facilitates in the formation of the selectively formed barrier layer 130 on the sidewalls of the trench 114 during the subsequent surface treatment process 128.

Figure 10:
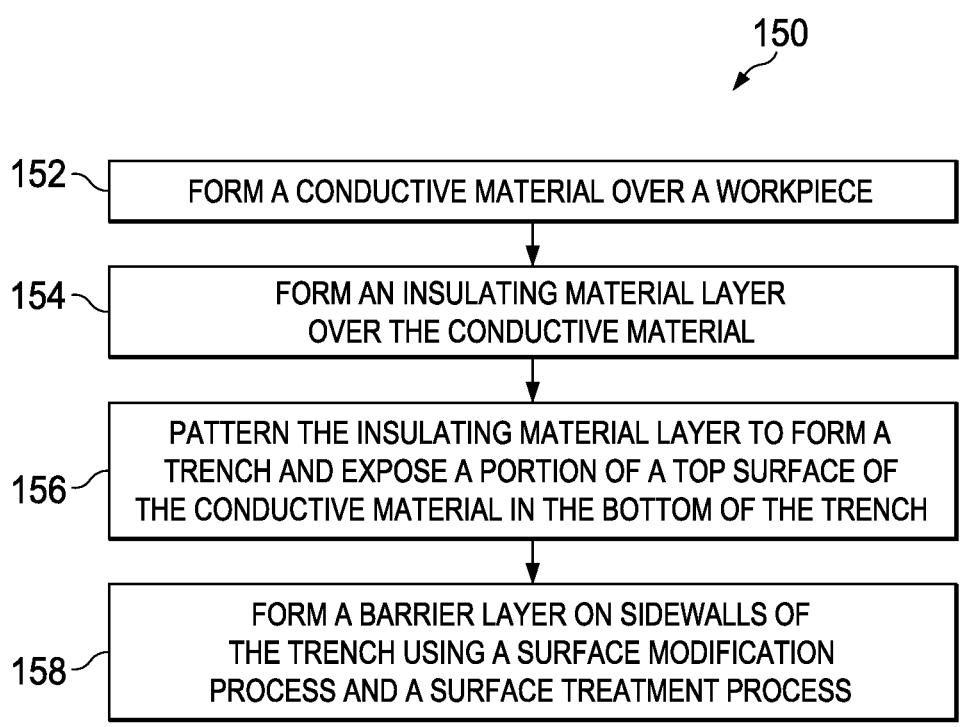
FIG. 10 is a flow chart illustrating a method of manufacturing a semiconductor device in accordance with some embodiments.

FIG. 10 is a flow chart 150 illustrating a method of manufacturing a semiconductor device 100 in accordance with some embodiments. In step 152, a conductive material 103 is formed over a workpiece 102. In step 154, an insulating material layer 106 is formed over the conductive material 103. In step 156, the insulating material layer 106 is patterned to form a trench 114 and expose a portion of a top surface of the conductive material 103 in the bottom of the trench 114. In step 158, a barrier layer 130 is formed on sidewalls of the trench 114 using a surface modification process 122 and a surface treatment process 128.

Some embodiments of the present disclosure include methods of manufacturing the semiconductor devices 100 that include forming the barrier layers 130. Other embodiments include semiconductor devices 100 that include the novel barrier layers 130 described herein.

Advantages of some embodiments of the disclosure include providing manufacturing methods for semiconductor devices 100 wherein novel barrier layers 130 are formed on sidewalls of trenches 114 within insulating material layers 106. The barrier layers 130 are selectively formed on the sidewalls of the trenches 114. The barrier layers 130 are not formed on the top surface of the conductive material 103 disposed beneath the insulating material layers 106, avoiding damage to or a deleterious impact on the conductivity, resistance, and electrical properties of the conductive material 103. Furthermore, because the barrier layers 130 are not formed on the surface of the conductive material 103, there is no concern for further conductive material 103 loss during a subsequent sputtering seed layer 132 step used to remove undesired barrier layers over the conductive material 103.

The barrier layer 130 advantageously recovers the damaged insulating material layer 106, making use of the damaged regions 116 and 126 of the insulating material layer 106 rather than needing to repair the damaged regions 116 or experience poor device 100 performance. A baking step to remove moisture from the insulating material layer 106 and a purge step for a gas such as $N_2$ to prevent moisture diffusion in the insulating material layer 106 can be eliminated in the process flow in some applications by the use of the novel barrier layers 130, as examples. The formation of a conformal barrier layer over the trench 114 comprising a material such as TaN to prevent diffusion of metal into the insulating material layer 106 can also be eliminated in some applications from the process flow by the use of the novel barrier layers 130 described herein, as another example. The barrier layer 130 also functions as an adhesion layer for the subsequently deposited seed layer 132 in some embodiments. The novel manufacturing methods, barrier layers 130 and via 140 structures and designs are easily implementable in manufacturing process flows.

The barrier layers 130 described herein include hydrocarbon materials such as graphite, which are excellent barrier materials having a lattice constant of about 2.462, as an example. As another example, graphene is very dense and impenetrable, preventing small molecules, even helium (He) from passing through. Thus, the barrier layers 130 described herein function as a strong protection layer against metal diffusion for the trench 114 sidewalls of the insulating material layer 106, advantageously.

Further advantages of the novel barrier layers 130 include a prolonged queue (Q) time, due to preventing the insulating material layer 106 from moisture absorption, resulting in a productivity improvement. After the damaged regions 116 are converted to hydrophobic damaged regions 126 using the surface modification process 122, the insulating material layer 106 can no longer absorb $H_2O$ molecules because the sidewalls of the trench 114 are covered by the hydrophobic damaged regions 126. The use of the selectively formed barrier layers 130 avoids the need to remove a conformally deposited barrier film from over the conductive material 103 top surface using chemical bombardment, which can cause conductive material 103 loss. Additionally, the novel selectively formed barrier layers 130 prevent a k value shift of the insulating material layer 106, leakage risks or problems, and RC shift.

In accordance with some embodiments of the present disclosure, a method of manufacturing a semiconductor device includes providing a workpiece including an insulating material layer disposed thereon. The insulating material layer includes a trench formed therein. The method includes forming a barrier layer on the sidewalls of the trench using a surface modification process and a surface treatment process.

In accordance with other embodiments, a method of manufacturing a semiconductor device includes forming a conductive material over a workpiece, forming an insulating material layer over the conductive material, and patterning the insulating material layer to form a trench and expose a portion of a top surface of the conductive material in the bottom of the trench. A barrier layer is formed on sidewalls of the trench using a surface modification process and a surface treatment process.

In accordance with other embodiments, a semiconductor device includes a workpiece, a conductive feature formed over the workpiece, and an insulating material layer disposed over the conductive feature. A via is coupled to the conductive feature, the via being disposed in the insulating material. A barrier layer disposed on sidewalls of the via proximate the insulating material layer. The barrier layer comprises a material selected from the group consisting essentially of hydrocarbon, halocarbon, sulfured carbon, silicon carbon, graphite, graphene, amorphous carbon, fullerene, and combinations thereof.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The invention claimed is:

1. A method of manufacturing a semiconductor device, the method comprising:
   providing a workpiece including an insulating material layer disposed thereon, the insulating material layer including a trench formed therein; and
   forming a barrier layer on sidewalls of the trench using a surface modification process and a surface treatment process.

2. The method according to claim 1, wherein the trench includes damaged regions disposed on the sidewalls thereof, and wherein the surface modification process comprises converting the damaged regions from a hydrophilic material to a hydrophobic material.

3. The method according to claim 1, wherein the surface modification process is performed in-situ with a post etch residue removal (PERR) process.

4. The method according to claim 1, wherein the surface modification process is performed after a post etch residue removal (PERR) process.

5. The method according to claim 1, wherein the surface modification process is performed before a post etch residue removal (PERR) process.

6. The method according to claim 1, wherein the surface treatment process comprises introducing a surface treatment compound selected from the group consisting essentially of a hydrocarbon, a halocarbon, sulfured carbon, silicon carbon, and combinations thereof; or wherein forming the barrier layer comprises forming a material selected from the group consisting essentially of hydrocarbon, halocarbon, sulfured carbon, silicon carbon, graphite, graphene, amorphous carbon, fullerene, and combinations thereof.

7. The method according to claim 1, wherein providing the workpiece comprises providing a workpiece including a conductive material disposed beneath the insulating material layer, wherein a top surface of the conductive material is exposed in the bottom of the trench, and wherein forming the barrier layer comprises not forming the barrier layer on the top surface of the conductive material.

8. A method of manufacturing a semiconductor device, the method comprising:
   forming a conductive material over a workpiece;
   forming an insulating material layer over the conductive material;
   patterning the insulating material layer to form a trench and expose a portion of a top surface of the conductive material in the bottom of the trench; and
   forming a barrier layer on sidewalls of the trench using a surface modification process and a surface treatment process.

9. The method according to claim 8, further comprising forming a seed layer over the insulating material layer, the barrier layer, and the top surface of the conductive material.

10. The method according to claim 9, wherein the conductive material comprises a first conductive material, and wherein the method further comprises forming a second conductive material over the seed layer.

11. The method according to claim 8, wherein the surface modification process comprises introducing a surface modification compound.

12. The method according to claim 11, wherein introducing the surface modification compound comprises introducing a hydrocarbon.

13. The method according to claim 8, wherein forming the barrier layer comprises selectively forming the barrier layer on the sidewalls of the trench.

14. The method according to claim 8, wherein patterning the insulating material layer comprises a dry etch process.

15. The method according to claim 14, wherein the dry etch process forms damaged regions on the sidewalls of the trench, and wherein forming the barrier layer comprises altering the damaged regions on the sidewalls of the trench.

16. The method according to claim 8, wherein patterning the insulating material layer comprising forming a photosensitive material over the insulating material or over a hard mask disposed over the insulating material, patterning the photosensitive material, etching the insulating material layer or the hard mask and the insulating material using the photosensitive material as an etch mask, and removing the photosensitive material, wherein removing the photosensitive material comprises forming damaged regions on the sidewalls of the trench, and wherein forming the barrier layer comprises altering the damaged regions on the sidewalls of the trench.

17. A method of manufacturing a semiconductor device, the method comprising:
   forming a trench in a dielectric layer, the trench including sidewalls defined by the dielectric layer and a bottom defined by an underlying conductive structure;
   performing a surface modification that selectively modifies the dielectric sidewalls without modifying the underlying conductive structure; and
   performing a surface treatment that selectively treats the modified dielectric sidewalls without treating the underlying conductive structure to form a barrier layer on the dielectric sidewalls.

18. The method of claim 17, wherein the surface modification process includes changing the dielectric sidewalls from hydrophilic to hydrophobic.

19. The method of claim 17, wherein the surface modification process includes introducing a hydrocarbon during a post etch residue removal process.

20. The method of claim 17, wherein the surface treatment process is selected from the group consisting of heating, catalyzing, electrolyzing, photo-irradiating, and combinations thereof.

* * * * *